United States Patent
Chiu et al.

(10) Patent No.: US 10,152,077 B2
(45) Date of Patent: Dec. 11, 2018

(54) VOLTAGE GENERATING CIRCUIT AND PRE-DRIVING SIGNAL GENERATING MODULE

(71) Applicant: Novatek Microelectronics Corp., Hsinchu (TW)

(72) Inventors: Hsiang-Yi Chiu, New Taipei (TW); Lan-Shan Cheng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 14/645,404

(22) Filed: Mar. 11, 2015

(65) Prior Publication Data
US 2015/0355663 A1    Dec. 10, 2015

(30) Foreign Application Priority Data
Jun. 6, 2014  (TW) ............................ 103119777 A

(51) Int. Cl.
*H02M 3/156* (2006.01)
*H03K 17/16* (2006.01)
(Continued)

(52) U.S. Cl.
CPC ............... *G05F 3/16* (2013.01); *H02M 1/44* (2013.01); *H02M 3/155* (2013.01); *H02M 2001/0029* (2013.01); *H03K 17/04* (2013.01)

(58) Field of Classification Search
CPC ......... H02M 2001/0029; H02M 3/156; H02M 3/158; H02M 3/1582; H02M 3/1584; H02M 3/1588; H03K 5/12
See application file for complete search history.

(56) References Cited

U.S. PATENT DOCUMENTS 5,399,908 A   3/1995   Donaldson
5,912,591 A   6/1999   Yamada
(Continued)

FOREIGN PATENT DOCUMENTS

CN   101116246   1/2008
CN   101316114   12/2008
(Continued)

OTHER PUBLICATIONS

"Office Action of Taiwan Counterpart Application", dated Sep. 11, 2015, p. 1-p. 11, in which the listed references were cited.
(Continued)

*Primary Examiner* — Gary L Laxton
(74) *Attorney, Agent, or Firm* — JCIPRNET

(57) ABSTRACT

A voltage generating circuit including a pre-driving unit and a voltage generating unit is provided. The pre-driving unit receives an oscillation signal and enhances a driving capability of the oscillation signal to generate a pre-driving signal. The voltage generating unit receives an input signal and the pre-driving signal, and generates an output signal according to the input signal and the pre-driving signal. The voltage generating unit generates a voltage signal according to the pre-driving signal. One of the pre-driving unit and the voltage generating unit adjusts a slew rate or a ringing component of the voltage signal by using the pre-driving signal. A pre-driving signal generating module for driving a voltage generating circuit is also provided.

30 Claims, 10 Drawing Sheets

(51) Int. Cl.
  *H03K 5/12* (2006.01)
  *G05F 3/16* (2006.01)
  *H02M 1/44* (2007.01)
  *H02M 3/155* (2006.01)
  *H03K 17/04* (2006.01)
  *H02M 1/00* (2006.01)

(56) References Cited

U.S. PATENT DOCUMENTS

| | | |
|---|---|---|
| 7,075,343 B2 | 7/2006 | Jiang |
| 2006/0119326 A1 | 6/2006 | Jiang |
| 2010/0213990 A1 | 8/2010 | Yang et al. |
| 2014/0159687 A1* | 6/2014 | Lee .................... H02M 3/1588 323/282 |
| 2014/0312863 A1* | 10/2014 | Arai .................... H02M 3/156 323/272 |

FOREIGN PATENT DOCUMENTS

| | | |
|---|---|---|
| CN | 101814842 | 8/2010 |
| CN | 102088251 | 6/2011 |
| EP | 0581016 | 2/1994 |
| TW | 200726091 | 7/2007 |
| TW | 200903966 | 1/2009 |
| TW | 201040690 | 11/2010 |

OTHER PUBLICATIONS

"Office Action of China Counterpart Application," dated Apr. 27, 2017, p. 1-p. 8, in which the listed references were cited.

"Office Action of China Counterpart Application," dated Dec. 5, 2017, p. 1-p. 8, in which the listed references were cited.

"Office Action of China Counterpart Application", dated May 9, 2018, p. 1-p. 8.

* cited by examiner

VOLTAGE GENERATING CIRCUIT AND PRE-DRIVING SIGNAL GENERATING MODULE

CROSS-REFERENCE TO RELATED APPLICATION

This application claims the priority benefit of Taiwan application serial no. 103119777, filed on Jun. 6, 2014. The entirety of the above-mentioned patent application is hereby incorporated by reference herein and made a part of this specification.

BACKGROUND OF THE DISCLOSURE

Field of the Disclosure

The disclosure relates to a voltage generating circuit and a pre-driving signal generating module, and more particularly, relates to a voltage generating circuit and a pre-driving signal generating module having a signal frequency hopping control function.

Description of Related Art

Generally, during operation, electronic circuits are prone to influence of electromagnetic interference (EMI) noises which reduces performances thereof in terms of operating capabilities. Take a voltage generating circuit for example, a control method of signal frequency hopping is proposed in the conventional technology for solving this problem. However, in practical application, the conventional technology can only reduce the EMI noises in low frequency and provide limited effectiveness for solving the EMI noises in higher frequency. Particularly, in a power conversion system, if the problem of the EMI noises is solved simply by reducing a slew rate of a driving signal, system efficiency thereof may be reduced instead.

SUMMARY OF THE DISCLOSURE

The disclosure provides a voltage generating circuit, which is capable of reducing the EMI noises by using the control method of signal frequency hopping while taking in consideration of the system efficiency.

The disclosure provides a pre-driving signal generating module, which is capable of reducing the EMI noises by using the control method of signal frequency hopping while taking in consideration of the system efficiency.

A voltage generating circuit of the disclosure includes a pre-driving unit and a voltage generating unit. The pre-driving unit receives an oscillation signal and generates a pre-driving signal based on the oscillation signal. The voltage generating unit receives an input signal and the pre-driving signal, and generates an output signal according to the input signal and the pre-driving signal. The voltage generating unit generates a voltage signal according to the pre-driving signal. One of the pre-driving unit and the voltage generating unit adjusts a slew rate or a ringing component of the voltage signal by using the pre-driving signal.

The oscillation signal generating module of the disclosure includes an oscillation signal generating and a loop control unit. The oscillation signal generating unit generates an oscillation signal. The pre-driving unit receives the oscillation signal, and enhances a driving capability of the oscillation signal to generate a pre-driving signal for driving a voltage generating circuit to generate an output signal. The voltage generating unit generates a voltage signal according to the pre-driving signal. The pre-driving unit adjusts a slew rate or a ringing component of the voltage signal by using the pre-driving signal.

In an embodiment of the disclosure, the voltage generating unit includes an energy storage device. The voltage generating unit controls a duty cycle of the energy storage device according to the voltage signal to generate the output signal.

In an embodiment of the disclosure, the pre-driving unit adjusts the slew rate or the ringing component of the voltage signal by using the pre-driving signal. The pre-driving unit includes a signal enhancing circuit and a signal adjusting circuit. The signal enhancing circuit receives the oscillation signal, and enhances the driving capability of the oscillation signal to generate the pre-driving signal. The signal adjusting circuit cooperates with the signal enhancing circuit, and generates the pre-driving signal according to the oscillation signal to adjust the slew rate or the ringing component of the voltage signal.

In an embodiment of the disclosure, the signal enhancing circuit includes a push-pull circuit. The push-pull circuit receives the oscillation signal, and enhances the driving capability of the oscillation signal to generate the pre-driving signal.

In an embodiment of the disclosure, the signal adjusting circuit includes one or more push-pull circuits. The push-pull circuit cooperates with the signal enhancing circuit, and generates the pre-driving signal according to the oscillation signal to adjust the slew rate or the ringing component of the voltage signal.

In an embodiment of the disclosure, the signal adjusting circuit further includes a switch unit. The switch unit selects to turn on or turn off a signal transmission path of the one or more push-pull circuits according to a control signal.

In an embodiment of the disclosure, each of the one or more push-pull circuits includes a pair of transistors. The transistors are disposed in a complementary manner, and channel widths thereof are all the same or partially the same.

In an embodiment of the disclosure, the voltage generating unit adjusts the slew rate or the ringing component of the voltage signal by using the pre-driving signal. The voltage generating unit includes a voltage generating portion and a signal adjusting circuit. The voltage generating portion includes an output capacitor. The signal adjusting circuit cooperates with the pre-driving unit and the output capacitor to adjust the slew rate or the ringing component of the voltage signal according to a control signal.

In an embodiment of the disclosure, the signal adjusting circuit includes one or more parallel capacitor and a switch unit. The parallel capacitors are coupled to the output capacitor in parallel. The switch unit cooperates with the pre-driving unit and the one or more parallel capacitors to adjust the slew rate or the ringing component of the voltage signal according to the control signal.

In an embodiment of the disclosure, capacitances of the parallel capacitors are all the same, partially the same or all different.

In an embodiment of the disclosure, the switch unit includes one or more switches, disposed corresponding to one or more parallel capacitors. The switches selects to turn on or turn off a signal transmission path of the corresponding one or more parallel capacitors.

In an embodiment of the disclosure, the voltage generating unit adjusts the slew rate or the ringing component of the voltage signal by using the pre-driving signal. The voltage generating unit includes a voltage generating portion and a signal adjusting circuit. The voltage generating portion includes a first power transistor. The signal adjusting circuit cooperates with the first power transistor to adjust the slew rate or the ringing component of the voltage signal according to the pre-driving signal or a ground signal.

In an embodiment of the disclosure, the signal adjusting circuit includes one or more second power transistors. The second power transistors are coupled to the first power transistor in parallel. The second power transistors cooperate with the first power transistor to adjust the slew rate or the ringing component of the voltage signal according to the pre-driving signal or a ground signal.

In an embodiment of the disclosure, the signal adjusting circuit further includes a switch unit. The switch unit selects to turn on or turn off a signal transmission path of the one or more second power transistors according to a control signal, so as to cooperate with the one or more second power transistors to adjust the slew rate or the ringing component of the voltage signal.

In an embodiment of the disclosure, channel widths of the second power transistors are all the same, partially the same or all different.

In an embodiment of the disclosure, the voltage generating unit includes a switched-inductor boost circuit, a switched-inductor buck circuit or a switched-inductor boost/buck circuit.

Based on above, in the exemplary embodiments of the disclosure, the voltage generating circuit and the pre-driving signal generating module adjusting the slew rate or the ringing component of the voltage signal by using the pre-driving signal are capable of reducing the EMI noises while taking in consideration of the system efficiency.

To make the above features and advantages of the disclosure more comprehensible, several embodiments accompanied with drawings are described in detail as follows.

DESCRIPTION OF THE EMBODIMENTS

According to exemplary embodiments of the disclosure, a control method of signal frequency hoping is provided, and capable of at least reducing high frequency EMI noises. Although means for reducing a slew rate of a pre-driving signal has been proposed in the related art to solve EMI issues for a signal transmitting system, such solution would lead to poor system efficiency. In the control method of signal frequency hoping according to the exemplary embodiments of the disclosure, a pre-driving signal is used to adjust a slew rate or a ringing component of a voltage signal, and thereby reduce the high frequency EMI noises while taking in consideration of the system efficiency. Embodiments are provided below to describe the disclosure in detail, though the disclosure is not limited to the provided embodiments, and the provided embodiments can be suitably combined.

Figure 1:
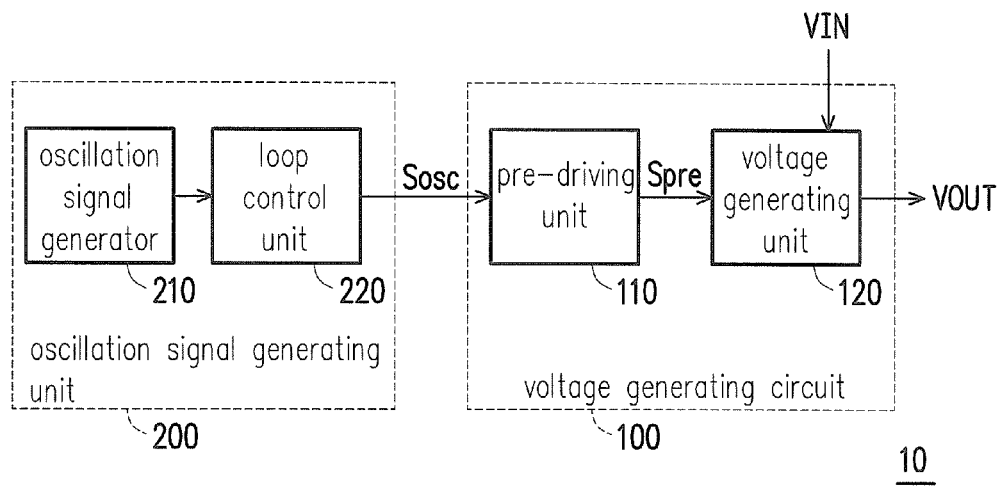
FIG. 1 is a schematic diagram illustrating a voltage generating system according to an exemplary embodiment of the disclosure.

FIG. 1 is a schematic diagram illustrating a voltage generating system according to an exemplary embodiment of the disclosure. Referring to FIG. 1, a voltage generating system 10 of the present embodiment includes an oscillation signal generating unit 200 and a voltage generating circuit 100. The voltage generating circuit 100 includes a pre-driving unit 110 and a voltage generating unit 120. The pre-driving unit 110 receives an oscillation signal Sosc provided by the oscillation signal generating unit 200 and enhances a driving capability of the oscillation signal Sosc to generate a pre-driving signal Spre. In the present embodiment, a method of enhancing the driving capability of the oscillation signal Sosc includes but not limited to use of a push-pull output circuit structure for generating the pre-driving signal Spre to increase an amplitude or a power of the pre-driving signal Spre, so that the pre-driving signal Spre has the sufficient driving capability for driving the voltage generating unit 120. In the present embodiment, the voltage generating unit 120 receives an input signal VIN and the pre-driving signal Spre, and generates an output signal VOUT accordingly. In the present embodiment, the voltage generating unit 120 generates a voltage signal according to the pre-driving signal Spre. The voltage signal is, for example, a signal with a signal waveform that is constantly toggling, as shown by a voltage signal LX in FIG. 4.

In the present embodiment, a method of reducing the high frequency EMI noises includes adjusting a slew rate of the pre-driving signal Spre by using of the pre-driving unit 110, so as to adjust a slew rate or a ringing component of the voltage signal LX. Alternatively, the present embodiment may also use the voltage generating unit 120 together with the pre-driving signal Spre to directly adjust the slew rate or the ringing component of the voltage signal LX. In the present embodiment, reduction of the high frequency noises may be applied to, for example, high frequency noises in several hundreds of MHz in 3G or LTE communication system, but the disclosure is not limited thereto.

In the present embodiment, when the voltage generating system 10 is applied in a DC-to-DC circuit system, the voltage generating unit 120 includes, for example, a switched-inductor boost circuit, a switched-inductor buck circuit or a switched-inductor boost/buck circuit. However, the disclosure is not limited thereto. The control method of signal frequency hopping provided in the exemplary embodiments of the disclosure may also be applied in other appropriate voltage generating systems. In the exemplary embodiment in which the voltage generating unit 120 is implemented by one of the switched-inductor boost circuit, the switched-inductor buck circuit or the switched-inductor boost/buck circuit, an energy storage device included in the voltage generating unit 120 may be, for example, an inductor L, as shown in the exemplary embodiments of FIG. 3, FIG. 7, FIG. 9, FIG. 11 or FIG. 12. In this example, the voltage generating unit 120 controls, for example, a duty cycle of the inductor L by using the voltage signal LX to generate the corresponding output signal VOUT. The duty cycle is, for example, a time ratio (duty ratio) occupied when the inductor L is turned on or turned off.

In the present embodiment, the oscillation signal generating unit 200 includes an oscillation signal generator 210 and a loop control unit 220. The oscillation signal generator 210 generates the oscillation signal Sosc. A signal processing is first performed on the generated oscillation signal Sosc by the loop control unit 220, wherein the signal processing includes but not limited to detection for whether there is bias in the oscillation signal Sosc (a corresponding adjustment will be made if so), or operation of current sensing on the voltage signal LX, so as accomplish operation for current mode control.

It should be noted that, the voltage generating circuit 100 is not limited to only receive the oscillation signal Sosc generated by the oscillation signal generating unit 200. The control method of signal frequency hopping of the voltage generating circuit 100 in the present embodiment may be applied to any other appropriate signals, so as to reduce the high frequency EMI noises for said appropriate signals.

From another perspective, the oscillation signal generating unit 200 and the pre-driving unit 110 of the present embodiment may serve as one pre-driving signal generating module to generate the pre-driving signal Spre for driving the voltage generating unit 120 to generate the voltage signal LX. In the present embodiment, the pre-driving unit 110 of the pre-driving signal generating module may adjust the slew rate or the ringing component of the voltage signal LX by using the pre-driving signal Spre. This control method of signal frequency hopping is capable of reducing the high frequency EMI noises.

Figure 2:
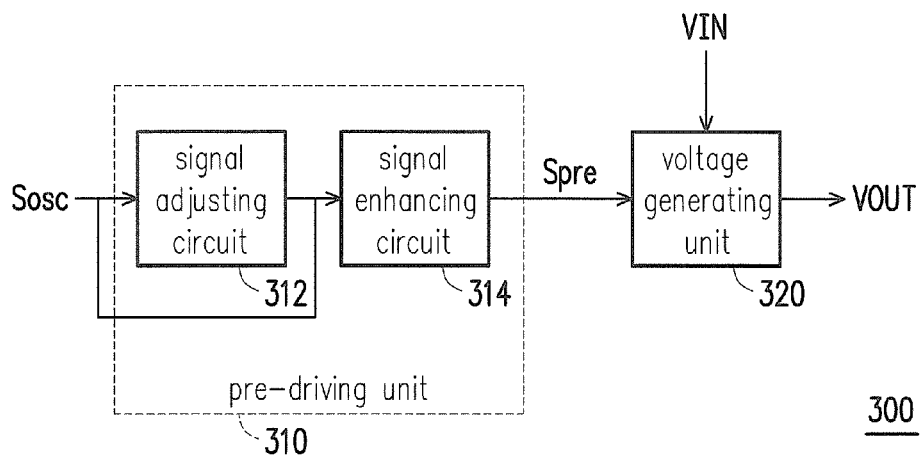
FIG. 2 is a schematic diagram illustrating a voltage generating circuit according to an embodiment of the disclosure.

FIG. 2 is a schematic diagram illustrating a voltage generating circuit according to an embodiment of the disclosure. Referring to FIG. 2, a voltage generating circuit 300 of the present embodiment uses, for example, a pre-driving unit 310 to adjust the slew rate or the ringing component of the voltage signal LX by using the pre-driving signal Spre, so as to reduce the EMI noises.

Specifically, the pre-driving unit 310 of the present embodiment includes a signal adjusting circuit 312 and a signal enhancing circuit 314. The signal enhancing circuit 314 receives the oscillation signal Sosc sent by a front-end circuit, and enhances the driving capability of the oscillation signal Sosc to generate the pre-driving signal Spre for driving a next-stage circuit. The signal adjusting circuit 312 cooperates with the signal enhancing circuit 314, and generates the pre-driving signal Spre according to the oscillation signal Sosc to adjust the slew rate or the ringing component of the voltage signal LX. In an embodiment, the signal adjusting circuit 312 may also adjust the slew rate or the ringing component of the voltage signal LX according to a control signal Vctrl.

Figure 3:
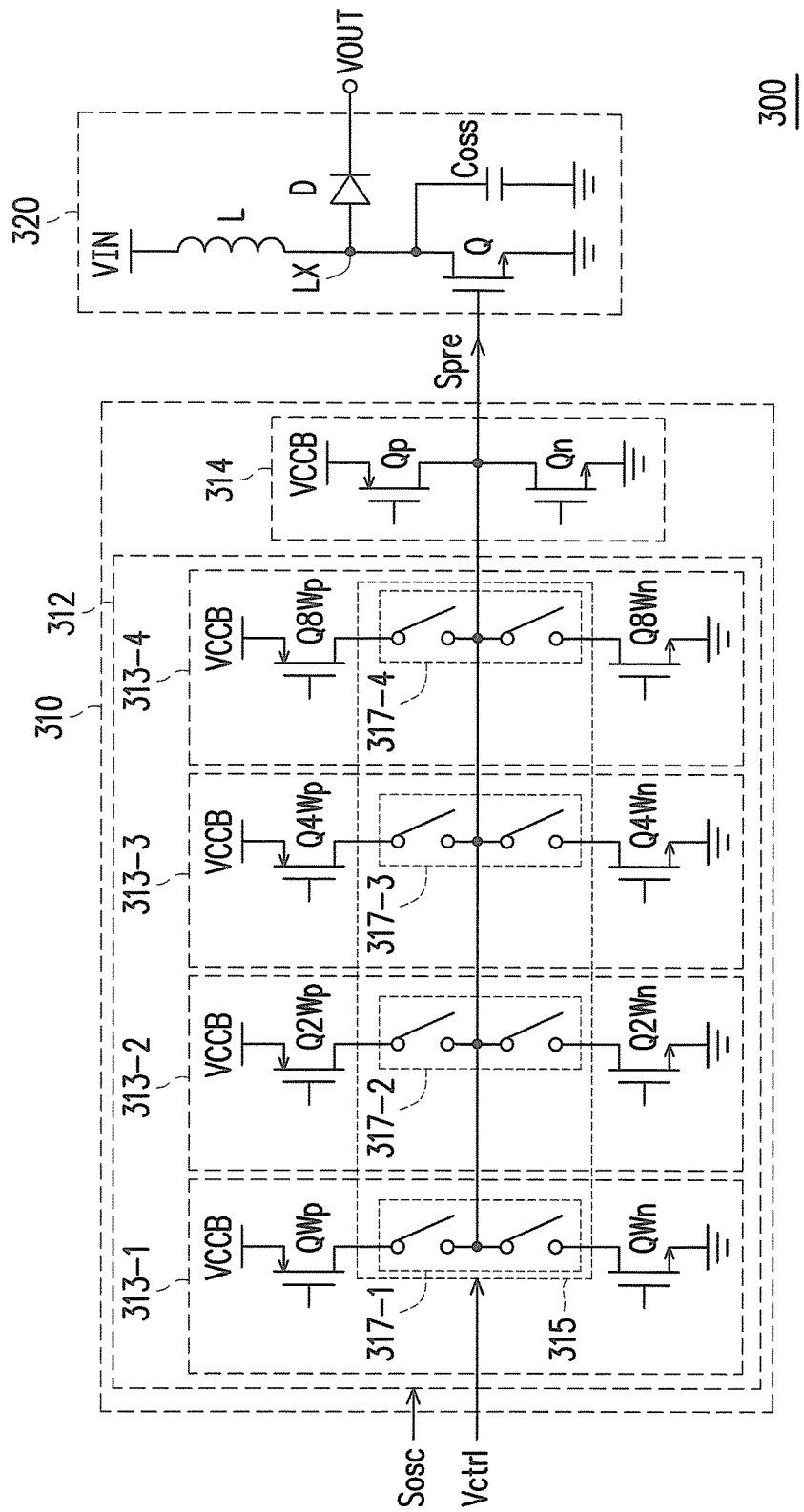
FIG. 3 illustrates an internal schematic diagram of the voltage generating circuit according to the embodiment of FIG. 2.

FIG. 3 illustrates an internal schematic diagram of the voltage generating circuit according to the embodiment of FIG. 2. Referring to FIG. 2 and FIG. 3 together, the signal enhancing circuit 314 of the present embodiment includes a push-pull circuit. The push-pull circuit includes a pair of transistors Qp and Qn disposed in a complementary manner, and gates of the two transistors receive the oscillation signal Sosc and enhance the driving capability of the oscillation signal Sosc to generate the pre-driving signal Spre.

In the present embodiment, the signal adjusting circuit 312 includes one or more push-pull circuits 313-1 to 313-4 and a switch unit 315. Specifically, each of the push-pull circuits 313-1 to 313-4 includes a pair of complementary transistors, and disposition configurations thereof are as shown in FIG. 3. For instance, the push-pull circuit 313-1 includes a P-type MOS transistor (referred to as a PMOS transistor hereinafter) QWp and a N-type MOS transistor (referred to as a NMOS transistor hereinafter) QWn. The PMOS transistor QWp is electrically connected to the NMOS transistor QWn through a switch set 317-1, and gate terminals of the PMOS transistor QWp and the NMOS transistor QWn receive the oscillation signal Sosc. The push-pull circuit 313-2 includes a PMOS transistor Q2Wp and a NMOS transistor Q2Wn. The PMOS transistor Q2Wp is electrically connected to the NMOS transistor Q2Wn through a switch set 317-2, and gate terminals of the PMOS transistor Q2Wp and the NMOS transistor Q2Wn receive the oscillation signal Sosc. The disposition configurations of rest of the push-pull circuits 313-3 and 313-4 may be inferred by analogy, as shown in FIG. 3. In the present embodiment, the push-pull circuits 313-1 to 314-4 may cooperate with the signal enhancing circuit 314 to effectively enhance the driving capability of the oscillation signal Sosc and thereby generate the pre-driving signal Spre.

In the present embodiment, channel widths of the transistors disposed in the push-pull circuits 313-1 to 313-4 are, for example, all the same or partially the same. For instance, the transistors QWp and QWn in the push-pull circuit 313-1 both include, for example, one times a channel width (W). In comparison with the transistors QWp and QWn, the transistors Q2Wp and Q2Wn in the push-pull circuit 313-2 both include, for example, two times the channel width (2W). Similarly, the transistors Q4Wp and Q4Wn in the push-pull circuit 313-3 and the transistors Q8Wp and Q8Wn in the push-pull circuit 313-4 include the channel widths being, for example, four times and eight times the channel width of the transistors QWp and QWn, respectively. In this example, the channel widths of the transistors are partially the same. In another embodiment, the channel widths of the transistors disposed in the push-pull circuits 313-1 to 313-4 may also be all the same. For example, all of the channel widths of the transistors QWp, QWn, Q2Wp, Q2Wn, Q4Wp, Q4Wn, Q8Wp and Q8Wn are, for example, one times the channel width (W).

It should be noted that, an amount of the push-pull circuits disposed in the signal adjusting circuit 312, a circuit structure of each of the push-pull circuits, and a size of the channel width of each of the transistors in the present embodiment may all be adjusted according to different actual circuit design, which are not particularly limited by the disclosure.

In the present embodiment, the switch unit 315 cooperates with the push-pull circuits 313-1 to 313-4 to adjust the slew rate of the pre-driving signal Spre according to the control signal Vctrl to generate the pre-driving signal Spre. In the present embodiment, the switch unit 315 includes a plurality of switch sets 317-1 to 317-4 disposed one by one corresponding to the push-pull circuits 313-1 to 313-4 for selecting to turn on or turn off signal transmission paths of the push-pull circuits 313-1 to 313-4 to the signal enhancing circuit 314 according to the control signal Vctrl.

Figure 11:
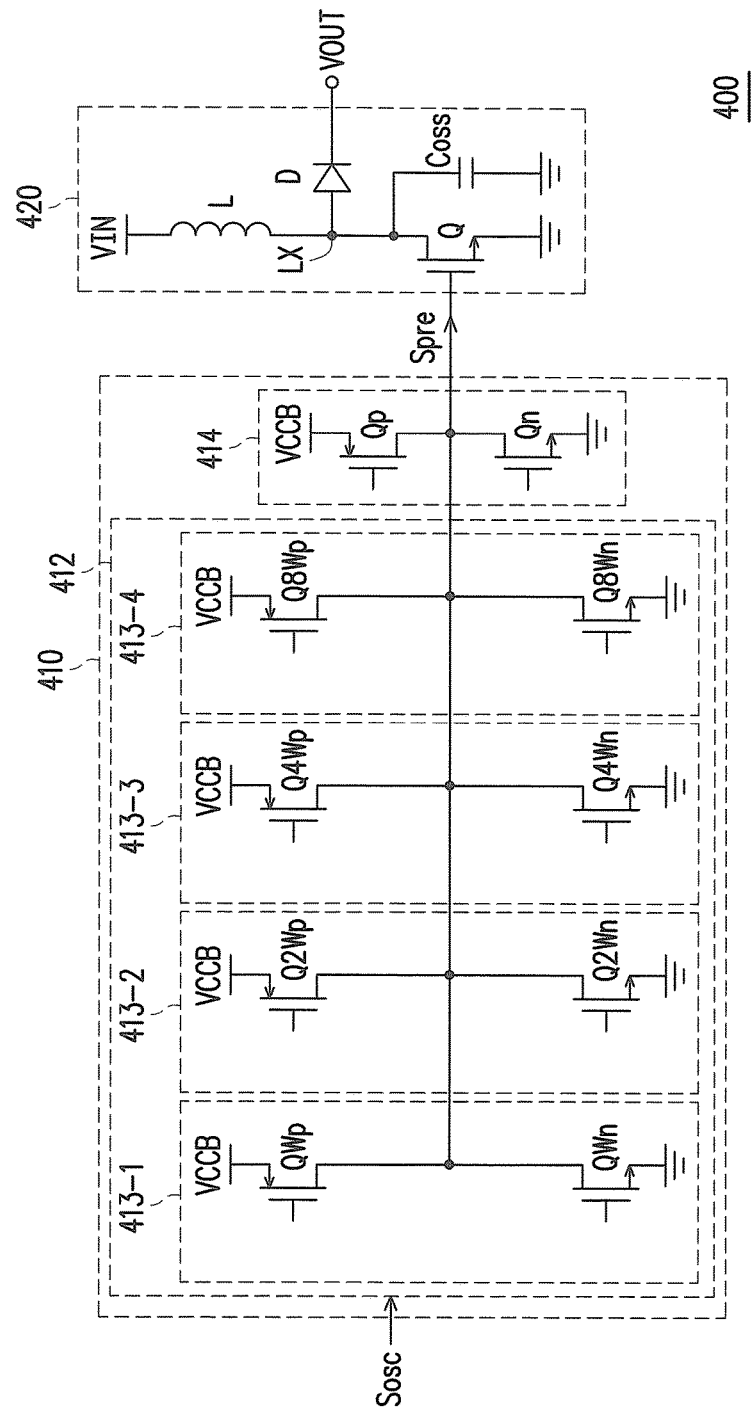
FIG. 11 illustrates another internal schematic diagram of the voltage generating circuit according to the embodiment of FIG. 2.

In the exemplary embodiments of the disclosure, in order to at least further enhance the driving capability of the pre-driving unit 310, it is also possible that the switch sets 317-1 to 317-4 are not connected in series between each pair of the complementary transistors included in the push-pull circuits 313-1 to 313-4, as shown in the exemplary embodiment of FIG. 11.

FIG. 11 illustrates another internal schematic diagram of the voltage generating circuit according to the embodiment of FIG. 2. Referring to FIG. 3 and FIG. 11 together, a signal adjusting circuit 412 of the present embodiment is similar to the signal adjusting circuit 312 of the embodiment of FIG. 3, and a major difference between the two is that there are not switch sets connected in series between each pair of the complementary transistors QWp, QWn, Q2Wp, Q2Wn, Q4Wp, Q4Wn, Q8Wp, Q8Wn in push-pull circuits 413-1 to 414-4, so as to provide a higher driving capability.

In the present embodiment, gates of the complementary transistors QWp, QWn, Q2Wp, Q2Wn, Q4Wp, Q4Wn, Q8Wp and Q8Wn in the push-pull circuits 413-1 to 413-4 may be directly controlled by the oscillation signal Sosc, or may not be controlled by the oscillation signal Sosc to be in an off-state. Among the transistors QWp, QWn, Q2Wp, Q2Wn, Q4Wp, Q4Wn, Q8Wp and Q8Wn, if a gate signal of any one of the transistors is directly controlled by the oscillation signal Sosc, the driving capability of said any one of the transistors may be contributed to a pre-driving unit 410 for providing the higher driving capability.

Figure 4:
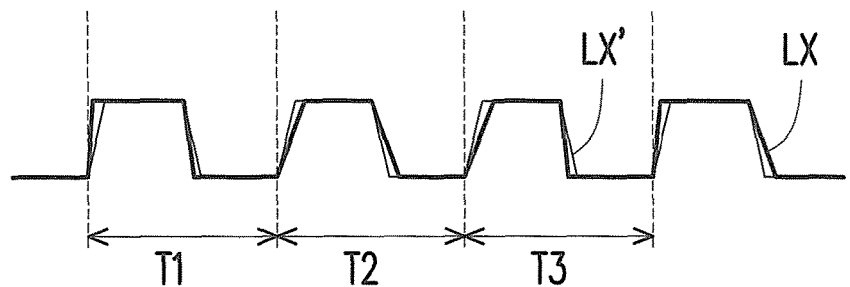
FIG. 4 illustrates a waveform diagram of the voltage signal according to the embodiment of FIG. 3.

FIG. 4 illustrates a waveform diagram of the voltage signal according to the embodiment of FIG. 3. Referring to FIG. 3 and FIG. 4 together, in FIG. 4, LX represents a waveform of the voltage signal in which the slew rate is adjusted, and LX' represents a waveform of the voltage signal in which the slew rate is not adjusted. In the present embodiment, the slew rate of the voltage signal LX changes under influence of changes in the slew rate of the pre-driving signal Spre. Therefore, although what illustrated in FIG. 4 is the waveform diagram of the voltage signal, a changing trend thereof also reflects changes in the slew rate of the pre-driving signal Spre.

In the present embodiment, based on the configuration of the oscillation signal Sosc, the PMOS transistors QWp, Q2Wp, Q4Wp and Q8Wp may all be turned on or turned off, and the NMOS transistors QWn, Q2Wn, Q4Wn and Q8Wn may all be turned on or turned off at the same time. Nevertheless, in the present embodiment, only one kind of the PMOS transistors QWp, Q2Wp, Q4Wp and Q8Wp and the NMOS transistors QWn, Q2Wn, Q4Wn and Q8Wn can be turned on at the same time. In other words, when the PMOS transistors QWp, Q2Wp, Q4Wp and Q8Wp are all turned on, the NMOS transistors QWn, Q2Wn, Q4Wn and Q8Wn are all turned off. By contrast, when the NMOS transistors QWn, Q2Wn, Q4Wn and Q8Wn are all turned on, the PMOS transistors QWp, Q2Wp, Q4Wp and Q8Wp are all turned off. In the embodiment of FIG. 3, the NMOS transistors QWn, Q2Wn, Q4Wn and Q8Wn are all turned on at the same time. In this case, the PMOS transistors QWp, Q2Wp, Q4Wp and Q8Wp are all turned off, and which of the paths to be turned on for connecting the NMOS transistors to the pre-driving signal Spre are determined by the switch sets 317-1 to 317-4. Accordingly, the driving capabilities of the NMOS transistors on the turned-on paths may then be enhanced, and vice versa. In the embodiment of FIG. 3, the control signal Vctrl adjusts the driving capability of the signal adjusting circuit 312 by controlling on-states of the switch sets 317-1 to 317-4. In the embodiment of FIG. 11, the switch sets 317-1 to 317-4 are removed, and the oscillation signal Sosc controls the on-states of the transistors by controlling the gates of the transistors, so as to adjust the driving capability of the signal adjusting circuit 412.

In the present embodiment, in correspondence to the operation of the PMOS transistors QWp, Q2Wp, Q4Wp and Q8Wp and the configuration of the control signal Vctrl, among the switch sets 317-1 to 317-4, one or more switches near the PMOS transistors QWp, Q2Wp, Q4Wp and Q8Wp may all or partially be turned on or turned off at the same time. When the one or more switches near the PMOS transistors QWp, Q2Wp, Q4Wp and Q8Wp are turned on, the corresponding one or more switches near the NMOS transistors QWn, Q2Wn, Q4Wn and Q8Wn are turned off correspondingly, and vice versa. Accordingly, when the one or more switches near the PMOS transistors QWp, Q2Wp, Q4Wp and Q8Wp are turned on, the signal transmission paths of one or more among the PMOS transistors QWp, Q2Wp, Q4Wp and Q8Wp to the signal enhancing circuit 314 are turned on. In this case, the turned-on PMOS transistors cooperate with the transistor Qp of the push-pull circuit of the signal enhancing circuit 314. Meanwhile, only the transistor Qp is turned on, and the transistor Qn is turned off. When the PMOS transistors are turned on, the pre-driving signal Spre is pulled to a high level, whereas the voltage signal LX is pulled to a low level. When a number of the PMOS transistors that are turned on becomes more, the slew rate of the pre-driving signal Spre is faster. Under influence of changes in the slew rate of the pre-driving signal Spre, a voltage-dropping section of the voltage signal LX in a period T2 of FIG. 4 is relatively flat in comparison with the same before the adjustment is made. When the number of the turned-on PMOS transistors becomes less, the slew rate of the pre-driving signal Spre is slower. Under influence of changes in the slew rate of the pre-driving signal Spre, a voltage-dropping section of the voltage signal LX in a period T1 of FIG. 4 is relatively steep in comparison with the same before the adjustment is made.

In contrast, in correspondence to the operation of the NMOS transistors QWn, Q2Wn, Q4Wn and Q8Wn and the configuration of the control signal Vctrl, among the switch sets 317-1 to 317-4, one or more switches near the NMOS transistors QWn, Q2Wn, Q4Wn and Q8Wn may all or partially be turned on or turned off at the same time. When the one or more switches near the PMOS transistors QWp, Q2Wp, Q4Wp and Q8Wp are turned off, the corresponding one or more switches near the NMOS transistors QWn, Q2Wn, Q4Wn and Q8Wn are turned on. At the time, the signal transmission paths of the NMOS transistors QWn, Q2Wn, Q4Wn and Q8Wn to the signal enhancing circuit 314 are turned on. In this case, the turned-on NMOS transistors cooperate with the transistor Qn of the push-pull circuit of the signal enhancing circuit 314. Meanwhile, only the transistor Qn is turned on, and the transistor Qp is turned off. When the NMOS transistor is turned on, the pre-driving signal Spre is pulled to the low level, whereas the voltage signal LX is pulled to the high level. When a number of the NMOS transistors that are turned on becomes more, the slew rate of the pre-driving signal Spre is faster. Under influence of changes in the slew rate of the pre-driving signal Spre, a voltage-rising section of the voltage signal LX in the period T2 of FIG. 4 is relatively flat in comparison with the same before the adjustment is made. When the number of the NMOS transistors becomes less, the slew rate of the pre-driving signal Spre is slower. Under influence of changes in the slew rate of the pre-driving signal Spre, a voltage-rising section of the voltage signal LX in the period T1 of FIG. 4 is relatively steep in comparison with the same before the adjustment is made.

Therefore, the signal adjusting circuit 312 of the present embodiment cooperating with the signal enhancing circuit 312 to adjust the slew rate of the pre-driving signal Spre according to the control signal Vctrl in each period is capable of breaking high frequency energy to reduce the EMI noises.

Figure 5:
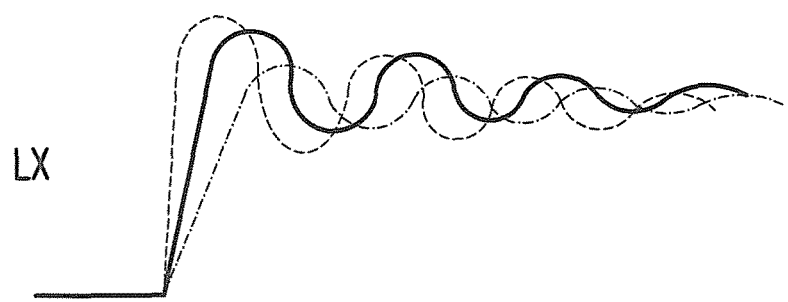
FIG. 5 illustrates a waveform diagram of the ringing component of the voltage signal according to the embodiment of FIG. 3.

FIG. 5 illustrates a waveform diagram of the ringing component of the voltage signal according to the embodiment of FIG. 3. Referring to FIG. 3 to FIG. 5 together, in FIG. 3, the slew rate of the voltage signal LX of the voltage generating unit 320 also changes under influence of changes in the slew rate of the pre-driving signal Spre. Therefore, in addition to reduction of the EMI noises by directly adjusting the slew rate of the pre-driving signal Spre, the signal adjusting circuit 312 of the present embodiment may also accomplish the purpose of reducing the EMI noises by indirectly adjusting the slew rate of the voltage signal LX.

In the embodiment of FIG. 3, the voltage generating unit 320 includes the switched-inductor boost circuit. The switched-inductor boost circuit generates the voltage signal LX to a back-end circuit for voltage conversion operation such as the DC-to-DC conversion. However, the disclosure is not limited thereto. In other embodiments, the voltage generating unit may also include the switched-inductor buck circuit or the switched-inductor boost/buck circuit. Enough teaching, suggestion, and implementation illustration for practical operation of said circuits can be obtained from the descriptions for FIG. 2 to FIG. 5, and thus related descriptions are not repeated hereinafter. In addition, in the embodiment of FIG. 11, enough teaching, suggestion, and implementation illustration for waveform variations and adjustments regarding the slew rate and the ringing component of the voltage signal can be obtained from the descriptions for FIG. 2 to FIG. 5, which are not repeated hereinafter.

Figure 6:
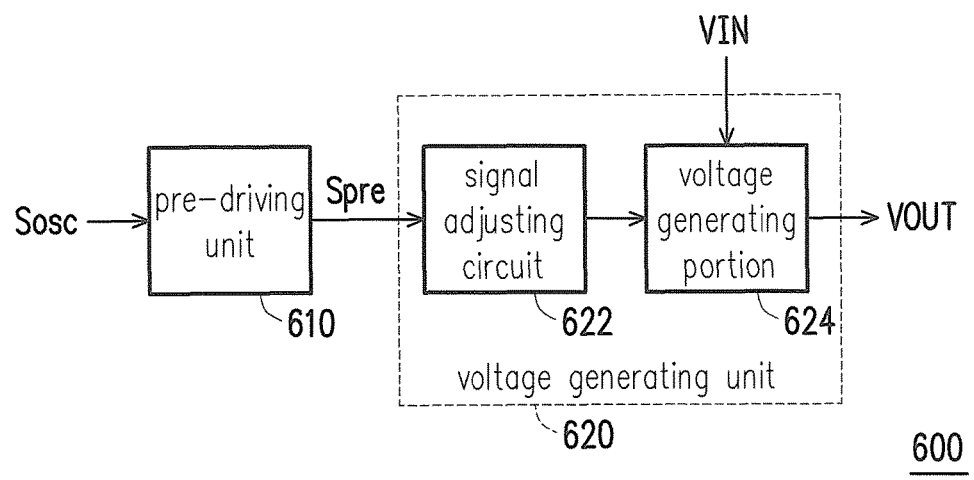
FIG. 6 is a schematic diagram illustrating a voltage generating circuit according to another embodiment of the disclosure.

FIG. 6 is a schematic diagram illustrating a voltage generating circuit according to another embodiment of the disclosure. Referring to FIG. 6, a voltage generating circuit 600 of the present embodiment uses, for example, a voltage generating unit 620 to adjust the slew rate or the ringing component of the voltage signal LX by using the pre-driving signal Spre, so as to reduce the EMI noises.

Specifically, a signal adjusting circuit 622 of the present embodiment is disposed in the voltage generating unit 620. The signal adjusting circuit 622 cooperates with a voltage generating portion 624 to adjust the slew rate or the ringing component of the voltage signal LX according to the pre-driving signal Spre. In other embodiments, the voltage generating portion 624 may include, for example, the switched-inductor boost circuit, the switched-inductor buck circuit or the switched-inductor boost/buck circuit, but the disclosure is not limited thereto. In an embodiment, the signal adjusting circuit 622 may also adjust the slew rate or the ringing component of the voltage signal LX according to a control signal Vctrl.

Figure 7:
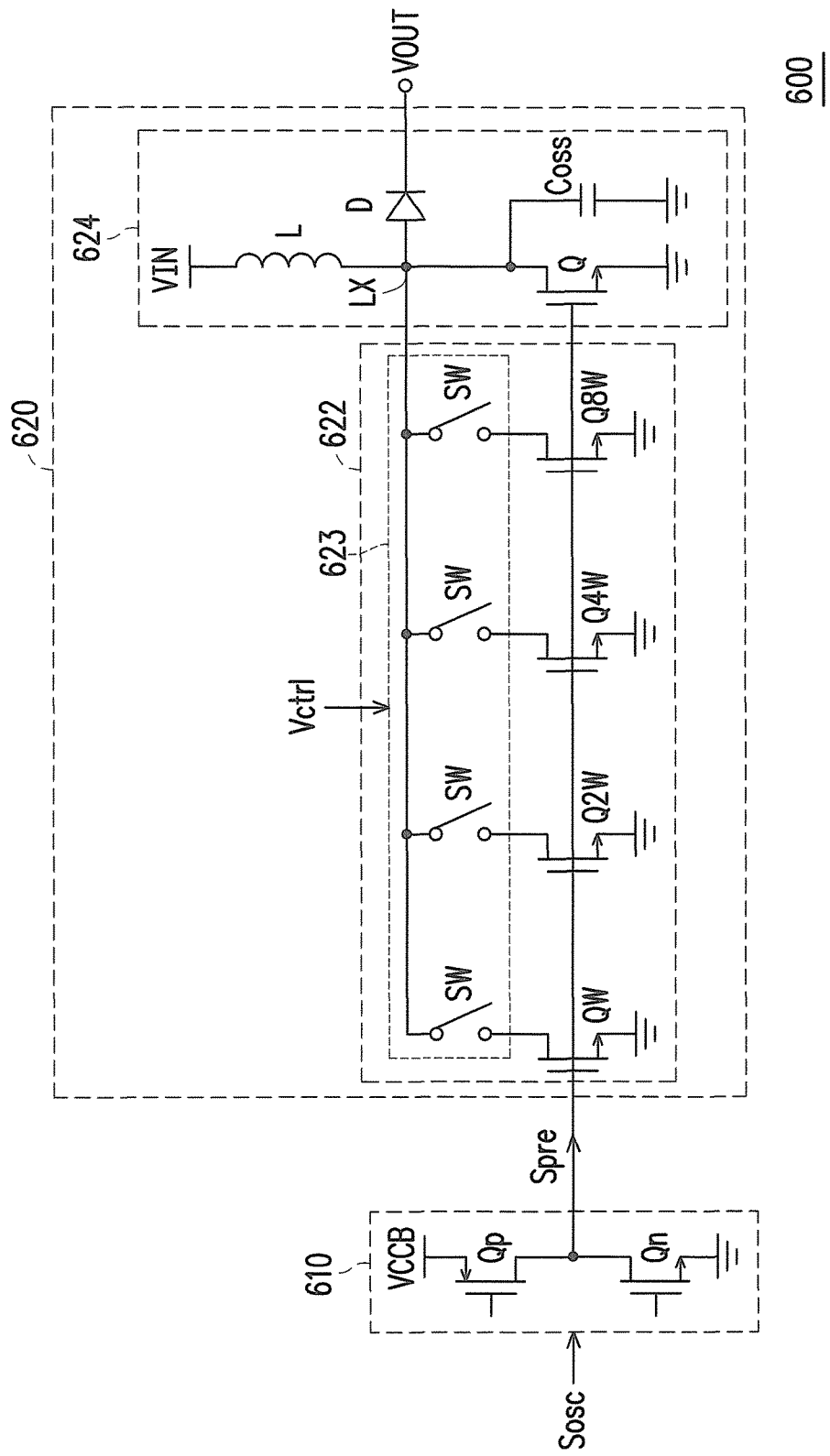
FIG. 7 illustrates an internal schematic diagram of the voltage generating circuit according to the embodiment of FIG. 6.

FIG. 7 illustrates an internal schematic diagram of the voltage generating circuit according to the embodiment of FIG. 6. Referring to FIG. 7, the voltage generating unit 620 includes a voltage generating portion 624 and a signal adjusting circuit 622. In this example, the voltage generating portion 624 is illustrated by including the switched-inductor boost circuit for example, but the disclosure is not limited thereto. The switched-inductor boost circuit includes a first power transistor Q. The signal adjusting circuit 622 cooperates with the first power transistor Q to adjust the slew rate or the ringing component of the voltage signal LX according to the control signal Vctrl.

In the present embodiment, the signal adjusting circuit 622 includes one or more second power transistors QW, Q2W, Q4W and Q8W and a switch unit 623. The second power transistors QW, Q2W, Q4W and Q8W are coupled to the first power transistor Q in parallel. The switch unit 623 cooperates with the second power transistors QW, Q2W, Q4W and Q8W to adjust the slew rate or the ringing component of the voltage signal LX according to the control signal.

In the present embodiment, the switch unit 623 includes one or more switches SW disposed one by one corresponding to the second power transistors QW, Q2W, Q4W and Q8W for selecting to turn on or turn off signal transmission paths of the second power transistors QW, Q2W, Q4W and Q8W to the first power transistor Q according to the control signal Vctrl.

In the present embodiment, channel widths of the second power transistors QW, Q2W, Q4W and Q8W are, for example, all the same, partially the same or all different. For instance, in comparison with the first power transistor Q, the channel widths of the second power transistors QW, Q2W, Q4W and Q8W are, for example, one times, two times, four times and eight times the channel width of the first power transistor Q, respectively. In this example, the channel widths of the transistors are all different. In another embodiment, the channel widths of the second power transistors disposed in the signal adjusting circuit 622 may also be all the same or partially the same. For example, the channel widths of the second power transistors QW, Q2W, Q4W and Q8W all includes, for example, one times the channel width (W). In this example, the channel widths of the transistors are all the same.

It should be noted that, an amount of the second power transistors disposed in the signal adjusting circuit 622, a circuit structure of each of the second power transistors, and a size of the channel width of each of the power transistor in the present embodiment may all be adjusted according to different actual circuit design, which are not particularly limited by the disclosure.

Figure 12:
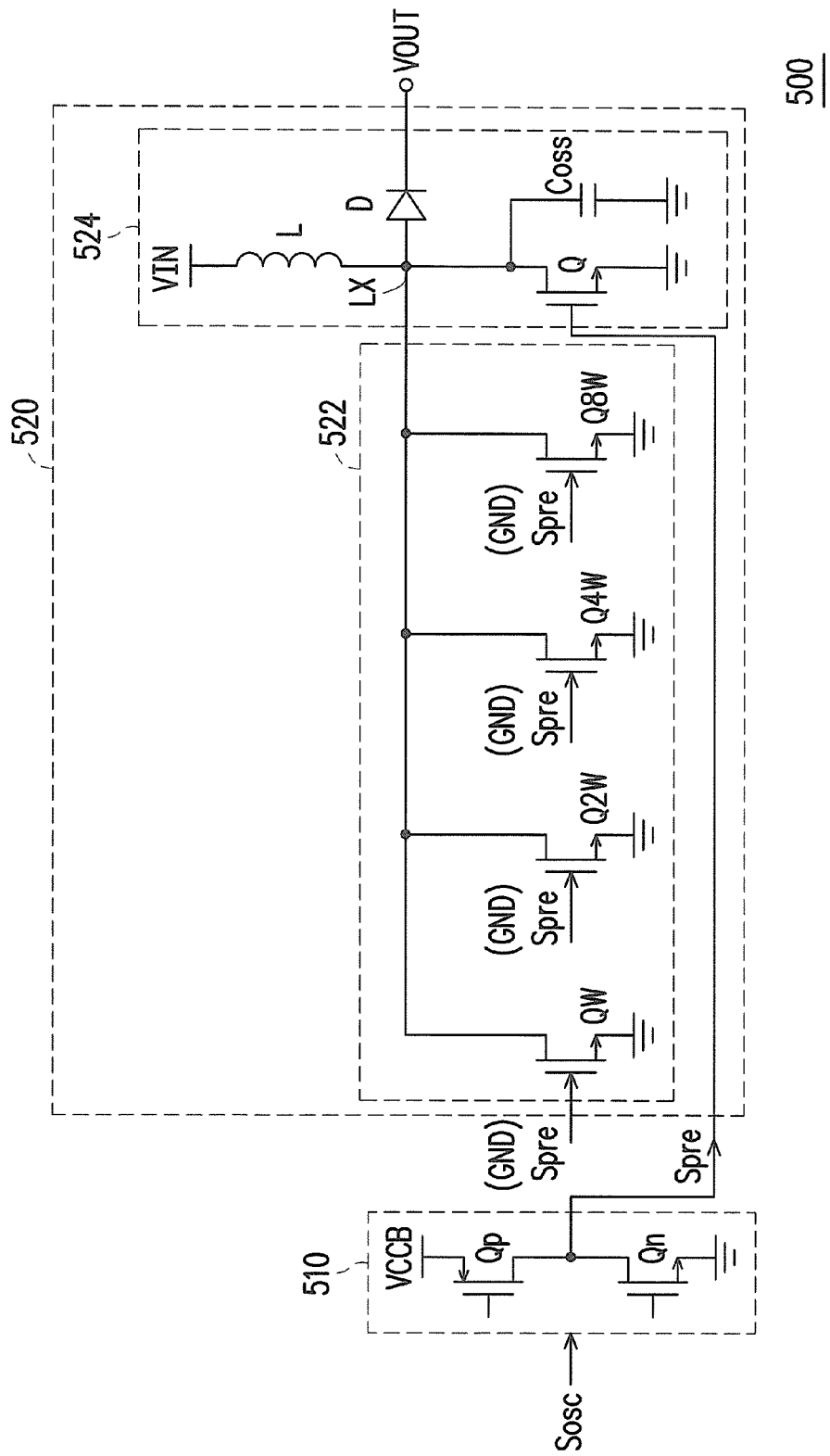
FIG. 12 illustrates another internal schematic diagram of the voltage generating circuit according to the embodiment of FIG. 6.

In the exemplary embodiments of the disclosure, in order to at least further enhance the driving capability of a pre-driving unit 520, it is also possible that a signal adjusting circuit 522 does not include the switch unit connected in series to the second power transistors QW, Q2W, Q4W and Q8W, as shown in the exemplary embodiment of FIG. 12. In FIG. 12, the second power transistors QW, Q2W, Q4W and Q8W may be controlled by the pre-driving signal Spre, and may also be grounded to turn off the second power transistors QW, Q2W, Q4W and Q8W. Among the second power transistors QW, Q2W, Q4W and Q8W, if a gate of any one of the second power transistors is controlled by the pre-driving signal Spre, the driving capability of said any one of the second power transistors may be contributed to the system. If a gate of any one of the second power transistors is grounded (e.g., coupled to a ground signal GND), said any one of the second power transistors is turned off, and the driving capability thereof is not contributed to the system.

FIG. 12 illustrates another internal schematic diagram of the voltage generating circuit according to the embodiment of FIG. 6. Referring to FIG. 7 and FIG. 12 together, the signal adjusting circuit 522 of the present embodiment is similar to the signal adjusting circuit 622 of the embodiment of FIG. 7, and a major difference between the two is that there are no switches SW between the second power transistors QW, Q2W, Q4W and Q8W and a diode D, so that a higher driving capability can be provided.

In the present embodiment, gates of the second power transistors QW, Q2W, Q4W and Q8W are indirectly controlled by the pre-driving signal Spre. The gates indirectly controlled by the pre-driving signal Spre indicate that the gates of the second power transistors may also be grounded during operations. Among the second power transistors QW, Q2W, Q4W and Q8W, if a gate signal of any one of the second power transistors changes together with changes in the pre-driving signal Spre, the driving capability of said any one of the second power transistors may be contributed to the voltage generating unit 520 for providing the higher driving capability. If a gate of any one of the second power transistors is grounded, said any one of the second power transistors is turned off, and the driving capability thereof is not contributed to the voltage generating unit 520.

Figure 8:
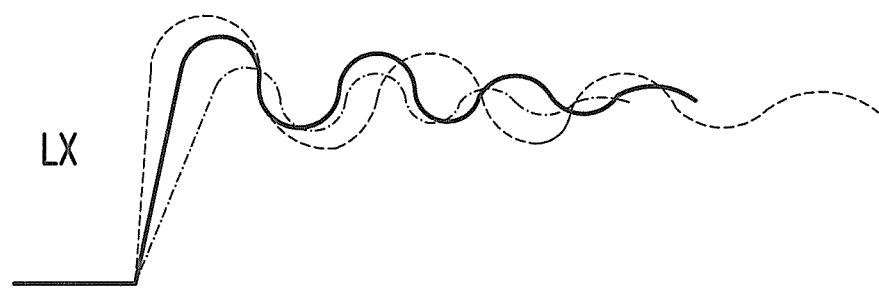
FIG. 8 illustrates a waveform diagram of the ringing component of the voltage signal according to the embodiment of FIG. 7.

FIG. 8 illustrates a waveform diagram of the ringing component of the voltage signal according to the embodiment of FIG. 7. Referring to FIG. 7 to FIG. 8 together, in FIG. 8, the slew rate, an oscillation amplitude of the ringing component and a time for restoring the signal to the stable state of the voltage signal LX of the voltage generating unit 620 may change under influence of the switches SW being turned on or not turned on. In the present embodiment, in correspondence to the configuration of the control signal Vctrl, one or more switches SW may all or partially be turned on or off at the same time. When the one or more switches SW are all or partially turned on at the same time, a signal transmission path of the corresponding input signal VIN to the ground is turned on. In this case, the second power transistors corresponding to the turned-on switches SW may cooperate with the turned-on first power transistor Q in the voltage generating portion 624 to adjust the slew rate or the ringing component of the voltage signal LX. An adjusting method thereof includes adjusting the oscillation frequency of the ringing component and a signal transition time of the voltage signal LX, as shown in FIG. 8. In the present embodiment, when a number of transistors that are turned on among the second power transistors QW, Q2W, Q4W and Q8W becomes more, an equivalent capacitance to be driven by the pre-driving signal Spre is greater. Accordingly, the slew rate of the voltage signal LX becomes slower. Furthermore, when the number of turned-on transistors among the second power transistors QW, Q2W, Q4W and Q8W becomes more, an output capacitor Coss is greater, such that the oscillation frequency of the ringing component of the voltage signal LX is changed accordingly. Therefore, the signal adjusting circuit 622 of the present embodiment is capable of modulating the slew rate of the voltage signal LX and the oscillating frequency of the ringing component thereof.

Therefore, the signal adjusting circuit 622 of the present embodiment cooperating with the voltage generating portion 624 to adjust the ringing component and slew rate of the voltage signal LX is capable of effectively reducing the EMI noises.

In the embodiment of FIG. 7, the voltage generating unit 620 includes the switched-inductor boost circuit. The switched-inductor boost circuit generates the voltage signal LX to a back-end circuit for voltage conversion operation such as the DC-to-DC conversion. However, the disclosure is not limited thereto. In other embodiments, the voltage generating unit may also include the switched-inductor buck circuit. Enough teaching, suggestion, and implementation illustration for practical operation of said circuits can be obtained from the descriptions for FIG. 6 to FIG. 8, and thus related descriptions are not repeated hereinafter. In addition, in the embodiment of FIG. 12, enough teaching, suggestion, and implementation illustration for waveform variations and adjustments regarding the slew rate and the ringing component of the voltage signal can be obtained from the descriptions for FIG. 6 to FIG. 8, which are not repeated hereinafter.

Figure 9:
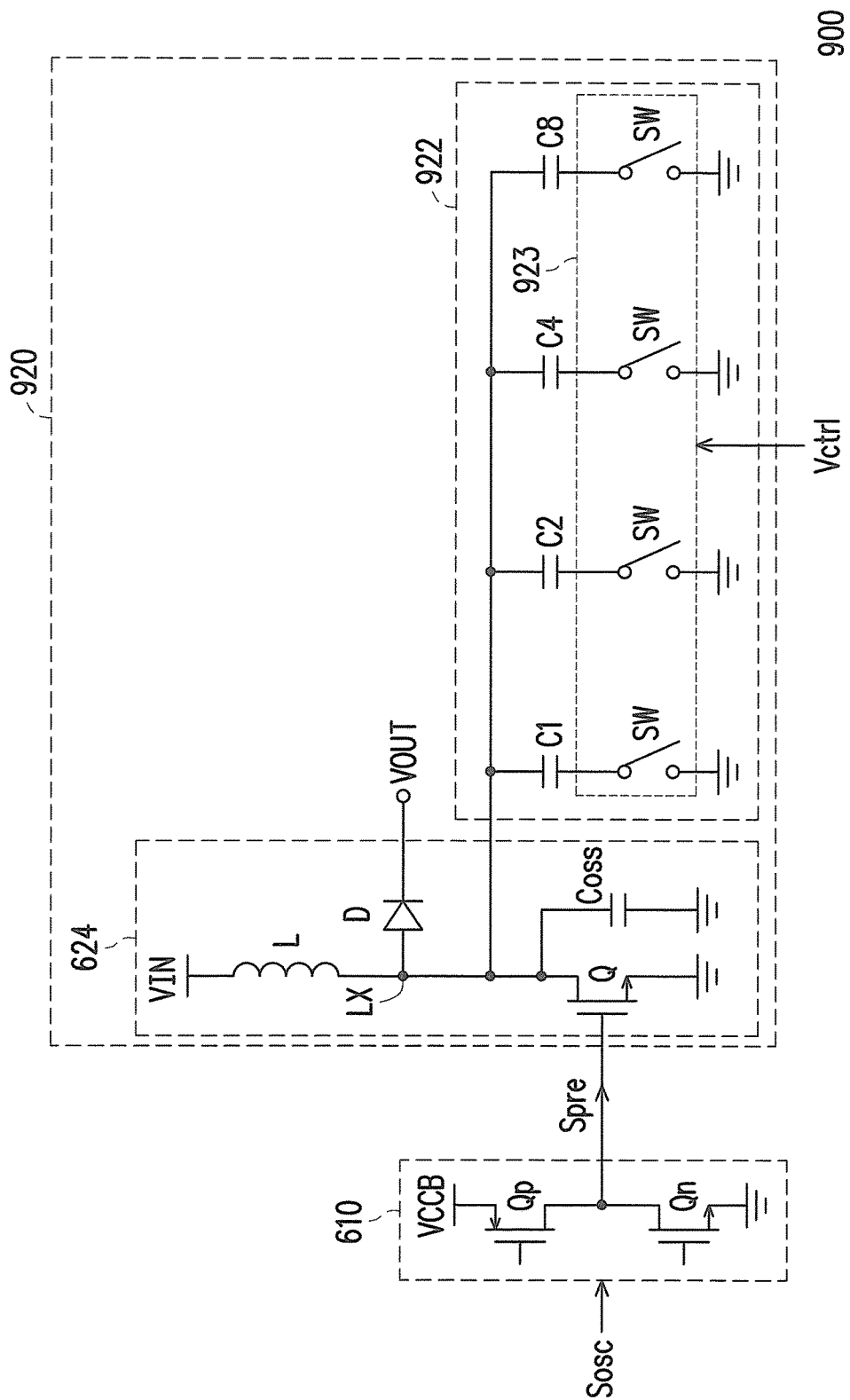
FIG. 9 illustrates another internal schematic diagram of the voltage generating circuit according to the embodiment of FIG. 6.

FIG. 9 illustrates another internal schematic diagram of the voltage generating circuit according to the embodiment of FIG. 6. Referring to FIG. 9, a voltage generating unit 920 of the present embodiment is similar to the voltage generating unit 620 of the embodiment of FIG. 7, a major difference between the two is, for example, structures and disposition methods of the signal adjusting circuit. In the present explanation, the voltage generating portion 624 is illustrated by including the switched-inductor boost circuit for example, but the disclosure is not limited thereto. The switched-inductor boost circuit includes an output capacitor Coss. A signal adjusting circuit 922 cooperates with the output capacitor Coss to adjust the ringing component of the voltage signal LX according to the control signal Vctrl.

In the present embodiment, the signal adjusting circuit 622 includes one or more parallel capacitors C1, C2, C4 and C8 and a switch unit 923. The parallel capacitors C1, C2, C4 and C8 are coupled to the output capacitor Coss in parallel. The switch unit 923 cooperates with the output parallel capacitors C1, C2, C4 and C8 to adjust the ringing component of the voltage signal LX according to the control signal.

In the present embodiment, the switch unit 923 includes one or more switches SW disposed one by one corresponding to the parallel capacitors C1, C2, C4 and C8 for selecting to turn on or turn off signal transmission paths of the parallel capacitors C1, C2, C4 and C8 to the ground according to the control signal Vctrl.

In the present embodiment, capacitances of the parallel capacitors C1, C2, C4 and C8 are, for example, all the same, partially the same or all different. For instance, in comparison with the capacitance of the parallel capacitor C1, the capacitances of the parallel capacitors C2, C4 and C8 are two times, four times and eight times the capacitance of the parallel capacitor C1, respectively. In this example, the capacitances of the parallel capacitors are all different. In another embodiment, the capacitances of the parallel capacitors disposed in the signal adjusting circuit 922 may also be all the same or partially the same. For example, the capacitances of the parallel capacitors C2, C4 and C8 are all designed to be identical to the capacitance of the parallel capacitor C1. In this example, the capacitances of the parallel capacitors are all the same.

It should be noted that, an amount of the parallel capacitors disposed in the signal adjusting circuit 922, a circuit structure of each of the parallel capacitors, and the capacitance of each of parallel capacitors in the present embodiment may all be adjusted according to different actual circuit design, which are not particularly limited by the disclosure.

Figure 10:
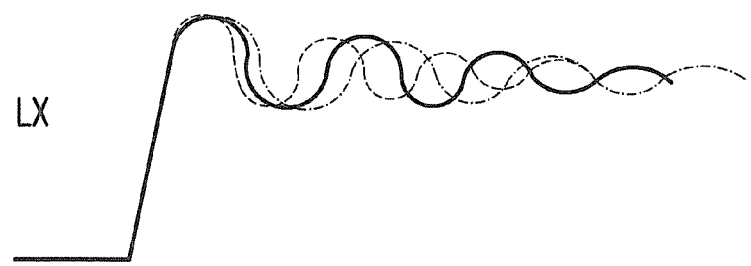
FIG. 10 illustrates a waveform diagram of the ringing component of the voltage signal according to the embodiment of FIG. 9.

FIG. 10 illustrates a waveform diagram of the ringing component of the voltage signal according to the embodiment of FIG. 9. Referring to FIG. 9 to FIG. 10 together, in FIG. 9, the oscillation amplitude of the ringing component and a time for restoring the signal to the stable state of the voltage signal LX of the voltage generating unit 920 may change under influence of the switches SW being turned on or not turned on. In the present embodiment, in correspondence to the configuration of the control signal Vctrl, one or more switches SW may all or partially be turned on or off at the same time. When the one or more switches SW are all or partially turned on at the same time, a signal transmission path of the corresponding input signal VIN to the ground is turned on. In this case, the parallel capacitors corresponding to the switches SW may cooperate with the output capacitor Coss in the voltage generating portion 624 to adjust the ringing component of the voltage signal LX. An adjusting method thereof includes adjusting the oscillation amplitude of the ringing component and the time for restoring the signal back to the stable state, as shown in FIG. 10.

Therefore, the signal adjusting circuit 922 of the present embodiment cooperating with the voltage generating portion 624 to adjust the ringing component of the voltage signal LX according to the control signal Vctrl is capable of effectively reducing the EMI noises.

In the embodiment of FIG. 9, the voltage generating unit 920 includes the switched-inductor boost circuit. The switched-inductor boost circuit generates the voltage signal LX to a back-end circuit for voltage conversion operation such as the DC-to-DC conversion. However, the disclosure is not limited thereto. In other embodiments, the voltage generating unit may also include the switched-inductor buck circuit. Enough teaching, suggestion, and implementation illustration for practical operation of said circuits can be obtained from the descriptions for FIG. 9 to FIG. 10, and thus related descriptions are not repeated hereinafter.

In summary, in the exemplary embodiments of the disclosure, the signal adjusting circuit may be disposed in the pre-driving unit or the voltage generating unit. In addition to reduction of the EMI noises by directly adjusting the slew rate of the pre-driving signal, the signal adjusting circuit may also accomplish the purpose of reducing the EMI noises by adjusting the slew rate or the ringing component of the voltage signal.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A voltage generating circuit, comprising:
   a pre-driving unit, configured to receive an oscillation signal, and generate a pre-driving signal based on the oscillation signal; and
   a voltage generating unit, configured to receive an input signal and the pre-driving signal, and generate an output signal according to the input signal and the pre-driving signal,
   wherein the voltage generating unit generates a voltage signal according to the pre-driving signal, one of the pre-driving unit and the voltage generating unit adjusts a slew rate of the voltage signal, an amplitude of the voltage signal is toggled periodically to have the same amplitude every first period, and the slew rate of the voltage signal is periodically varied to have the same slew rate with every second period, wherein the second period comprises a plurality of the first periods of the voltage signal, and
   wherein the slew rates of the voltage signal in two adjacent ones of the first periods in the second period are different.

2. The voltage generating circuit of claim 1, wherein the voltage generating unit comprises an energy storage device, and the voltage generating unit controls a duty cycle of the energy storage device by using the voltage signal to generate the output signal.

3. The voltage generating circuit of claim 1, wherein the pre-driving unit adjusts the slew rate of the voltage signal by using the pre-driving signal, and the pre-driving unit comprises:
   a signal enhancing circuit, configured to receive the oscillation signal, and enhance a driving capability of the oscillation signal to generate the pre-driving signal; and
   a signal adjusting circuit, cooperating with the signal enhancing circuit, and configured to generate the pre-driving signal according to the oscillation signal to adjust the slew rate of the voltage signal.

4. The voltage generating circuit of claim 3, wherein the signal enhancing circuit comprises a push-pull circuit configured to receive the oscillation signal, and enhance the driving capability of the oscillation signal to generate the pre-driving signal.

5. The voltage generating circuit of claim 3, wherein the signal adjusting circuit comprises:
   one or more push-pull circuits, cooperating with the signal enhancing circuit, and configured to generate the pre-driving signal according to the oscillation signal to adjust the slew rate of the voltage signal.

6. The voltage generating circuit of claim 5, wherein the signal adjusting circuit further comprises:
   a switch unit, configured to select to turn on or turn off a signal transmission path of the one or more push-pull circuits according to a control signal.

7. The voltage generating circuit of claim 5, wherein each of the one or more push-pull circuits comprises a pair of transistors disposed in a complementary manner, and channel widths of the transistors of the one or more push-pull circuits are all the same or partially the same.

8. The voltage generating circuit of claim 1, wherein the voltage generating unit adjusts the slew rate of the voltage signal by using the pre-driving signal, and the voltage generating unit comprises:
   a voltage generating portion, comprising an output capacitor; and
   a signal adjusting circuit, cooperating with the pre-driving unit and the output capacitor, and configured to adjust the slew rate of the voltage signal according to a control signal.

9. The voltage generating circuit of claim 8, wherein the signal adjusting circuit comprises:
   one or more parallel capacitors, coupled to the output capacitor in parallel; and
   a switch unit, cooperating with the pre-driving unit and the one or more parallel capacitors, and configured to adjust the slew rate of the voltage signal according to the control signal.

10. The voltage generating circuit of claim 9, wherein capacitances of the one or more parallel capacitors are all the same, partially the same or all different.

11. The voltage generating circuit of claim 9, wherein the switch unit comprises one or more switches, disposed corresponding to the one or more parallel capacitors, and configured to select to turn on or turn off a signal transmission path of the corresponding one or more parallel capacitors according to the control signal.

12. The voltage generating circuit of claim 1, wherein the voltage generating unit adjusts the slew rate of the voltage signal by using the pre-driving signal, and the voltage generating unit comprises:
   a voltage generating portion, comprising a first power transistor; and a signal adjusting circuit, cooperating with the first power transistor, and configured to adjust the slew rate of the voltage signal according to the pre-driving signal or a ground signal.

13. The voltage generating circuit of claim 12, wherein the signal adjusting circuit comprises:
one or more second power transistors, coupled to the first power transistor in parallel, and cooperating with the first power transistor, and configured to adjust the slew rate of the voltage signal according to the pre-driving signal or the ground signal.

14. The voltage generating circuit of claim 13, wherein the signal adjusting circuit further comprises:
a switch unit, configured to select to turn on or turn off a signal transmission path of the one or more second power transistors according to a control signal, so as to cooperate with the one or more second power transistors to adjust the slew rate of the voltage signal.

15. The voltage generating circuit of claim 13, wherein channel widths of the one or more second power transistors are all the same, partially the same or all different.

16. The voltage generating circuit of claim 1, wherein the voltage generating unit comprises a switched-inductor boost circuit, a switched-inductor buck circuit or a switched-inductor boost/buck circuit.

17. A pre-driving signal generating module, comprising:
an oscillation signal generating unit, configured to generate an oscillation signal; and
a pre-driving unit, configured to receive the oscillation signal, and based on the oscillation signal, generate a pre-driving signal for driving a voltage generating unit to generate an output signal,
wherein the voltage generating unit generates a voltage signal according to the pre-driving signal, one of the pre-driving unit and the voltage generating unit adjusts a slew rate of the voltage signal, an amplitude of the voltage signal is toggled periodically to have the same amplitude every first period, and the slew rate of the voltage signal is periodically varied to have the same slew rate with every second period, wherein the second period comprises a plurality of the first periods of the voltage signal, and
wherein the slew rates of the voltage signal in two adjacent ones of the first periods in the second period are different.

18. The pre-driving signal generating module of claim 17, wherein the voltage generating unit comprises an energy storage device, and the voltage generating unit controls a duty cycle of the energy storage device by using the voltage signal to generate the output signal.

19. The pre-driving signal generating module of claim 17, wherein the pre-driving unit adjusts the slew rate of the voltage signal by using the pre-driving signal, and the pre-driving unit comprises:
a signal enhancing circuit, configured to receive the oscillation signal, and enhance a driving capability of the oscillation signal to generate the pre-driving signal; and
a signal adjusting circuit, cooperating with the signal enhancing circuit, and configured to generate the pre-driving signal according to the oscillation signal to adjust the slew rate of the voltage signal.

20. The pre-driving signal generating module of claim 19, wherein the signal enhancing circuit comprises a push-pull circuit configured to receive the oscillation signal, and enhance the driving capability of the oscillation signal to generate the pre-driving signal.

21. The pre-driving signal generating module of claim 19, wherein the signal adjusting circuit comprises:
one or more push-pull circuits, cooperating with the signal enhancing circuit, and configured to generate the pre-driving signal according to the oscillation signal to adjust the slew rate of the voltage signal.

22. The pre-driving signal generating module of claim 21, wherein the signal adjusting circuit further comprises:
a switch unit, configured to select to turn on or turn off a signal transmission path of the one or more push-pull circuits according to a control signal.

23. The pre-driving signal generating module of claim 21, wherein each of the one or more push-pull circuits comprises a pair of transistors disposed in a complementary manner, and channel widths of the transistors of the one or more push-pull circuits are all the same or partially the same.

24. The pre-driving signal generating module of claim 17, wherein the voltage generating unit comprises a switched-inductor boost circuit, a switched-inductor buck circuit or a switched-inductor boost/buck circuit.

25. The voltage generating circuit of claim 1, wherein the slew rate of the voltage signal is adjusted to be gradually increased or decreased in the period comprising the plurality of consecutive periods of the voltage signal.

26. The voltage generating circuit of claim 1, wherein the consecutive periods are aligned with oscillation periods of the oscillation signal.

27. The pre-driving signal generating module of claim 17, wherein the slew rate of the voltage signal is adjusted to be gradually increased or decreased in the period comprising the plurality of consecutive periods of the voltage signal.

28. The pre-driving signal generating module of claim 17, wherein the consecutive periods are aligned with oscillation periods of the oscillation signal.

29. A voltage generating circuit, comprising:
a pre-driving unit, configured to receive an oscillation signal, and generate a pre-driving signal based on the oscillation signal; and
a voltage generating unit, configured to receive an input signal and the pre-driving signal, and generate an output signal according to the input signal and the pre-driving signal,
wherein the voltage generating unit generates a voltage signal according to the pre-driving signal, and the pre-driving unit adjusts a slew rate of the voltage signal by using the pre-driving signal,
wherein the pre-driving unit comprises: a signal enhancing circuit, configured to receive the oscillation signal, and enhance a driving capability of the oscillation signal to generate the pre-driving signal; and a signal adjusting circuit, cooperating with the signal enhancing circuit, and configured to generate the pre-driving signal according to the oscillation signal to adjust the slew rate of the voltage signal,
wherein the signal adjusting circuit comprises: one or more push-pull circuits, cooperating with the signal enhancing circuit, and configured to generate the pre-driving signal according to the oscillation signal to adjust the slew rate of the voltage signal.

30. A pre-driving signal generating module, comprising:
an oscillation signal generating unit, configured to generate an oscillation signal; and
a pre-driving unit, configured to receive the oscillation signal, and based on the oscillation signal, generate a pre-driving signal for driving a voltage generating unit to generate an output signal, wherein the voltage generating unit generates a voltage signal according to the pre-driving signal, and the pre-driving unit adjusts a slew rate of the voltage signal by using the pre-driving signal, wherein the pre-driving unit comprises: a signal enhancing circuit, configured to receive the oscillation signal, and enhance a driving capability of the oscillation signal to generate the pre-driving signal; and a signal adjusting circuit, cooperating with the signal enhancing circuit, and configured to generate the pre-driving signal according to the oscillation signal to adjust the slew rate of the voltage signal, wherein the signal adjusting circuit comprises: one or more push-pull circuits, cooperating with the signal enhancing circuit, and configured to generate the pre-driving signal according to the oscillation signal to adjust the slew rate of the voltage signal.

* * * * *